(12) United States Patent
Yoshida et al.

(10) Patent No.: US 9,481,812 B2
(45) Date of Patent: Nov. 1, 2016

(54) POLISHING AGENT, POLISHING METHOD AND ADDITIVE LIQUID FOR POLISHING

(71) Applicant: ASAHI GLASS COMPANY, LIMITED, Chiyoda-ku (JP)

(72) Inventors: Iori Yoshida, Tokyo (JP); Nobuyuki Takagi, Tokyo (JP); Masaru Suzuki, Tokyo (JP); Toshihiko Otsuki, Tokyo (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 0 days.

(21) Appl. No.: 14/808,555

(22) Filed: Jul. 24, 2015

(65) Prior Publication Data

US 2016/0024351 A1  Jan. 28, 2016

(30) Foreign Application Priority Data

Jul. 25, 2014  (JP) .................. 2014-151496

(51) Int. Cl.

| | |
|---|---|
| *C09G 1/04* | (2006.01) |
| *C08K 3/22* | (2006.01) |
| *C08L 77/02* | (2006.01) |
| *C08G 73/02* | (2006.01) |
| *C08L 79/02* | (2006.01) |
| *C08G 69/40* | (2006.01) |
| *H01L 21/3105* | (2006.01) |
| *H01L 21/306* | (2006.01) |

(52) U.S. Cl.
CPC .............. *C09G 1/04* (2013.01); *C08G 69/40* (2013.01); *C08G 73/028* (2013.01); *C08K 3/22* (2013.01); *C08L 77/02* (2013.01); *C08L 79/02* (2013.01); *H01L 21/31053* (2013.01); *H01L 21/30625* (2013.01)

(58) Field of Classification Search
None
See application file for complete search history.

(56) References Cited

U.S. PATENT DOCUMENTS

| | | | |
|---|---|---|---|
| 7,071,105 B2 | 7/2006 | Carter et al. | |
| 7,442,645 B2 | 10/2008 | Carter et al. | |
| 8,486,169 B2 | 7/2013 | Carter et al. | |
| 2003/0150600 A1* | 8/2003 | Hamamura | B05D 7/16 165/133 |
| 2004/0152309 A1 | 8/2004 | Carter et al. | |
| 2006/0144824 A1 | 7/2006 | Carter et al. | |
| 2006/0196848 A1 | 9/2006 | Carter et al. | |
| 2009/0029633 A1 | 1/2009 | Carter et al. | |
| 2009/0093118 A1* | 4/2009 | Uotani | B24B 37/044 438/692 |
| 2009/0209104 A1* | 8/2009 | Kimura | C09G 1/02 438/693 |
| 2011/0039475 A1* | 2/2011 | Hoshi | B24B 37/044 451/28 |

(Continued)

FOREIGN PATENT DOCUMENTS

JP  2006-520530  9/2006

*Primary Examiner* — Anita Alanko
(74) *Attorney, Agent, or Firm* — Oblon, McClelland, Maier & Neustadt, L.L.P.

(57) ABSTRACT

A polishing agent includes a particle of a metal oxide, a water-soluble polyamide, an organic acid and water. The water-soluble polyamide has a tertiary amino group and/or an oxyalkylene chain in a molecule thereof. The polishing agent has a pH of 7 or less.

15 Claims, 2 Drawing Sheets

(56) References Cited

U.S. PATENT DOCUMENTS

| | | | |
|---|---|---|---|
| 2011/0207327 A1* | 8/2011 | Suzuki | C09G 1/02 438/693 |
| 2014/0302752 A1* | 10/2014 | Tsuchiya | B24B 37/044 451/41 |
| 2015/0014579 A1* | 1/2015 | Miwa | H01L 21/02024 252/79.5 |
| 2015/0159049 A1* | 6/2015 | Amano | C09G 1/02 438/693 |
| 2016/0108284 A1* | 4/2016 | Yoshizaki | C09K 3/1463 252/79.1 |

* cited by examiner

POLISHING AGENT, POLISHING METHOD AND ADDITIVE LIQUID FOR POLISHING

CROSS-REFERENCE TO RELATED APPLICATIONS

This application claims priority from Japanese Patent Application No. 2014-151496 filed on Jul. 25, 2014, the entire subject matter of which is incorporated herein by reference.

BACKGROUND OF THE INVENTION

1. Technical Field

The present invention relates to a polishing agent, a polishing method, and an additive liquid for polishing. More specifically, the present invention relates to a polishing agent for chemical mechanical polishing in the production of a semiconductor integrated circuit, a polishing method using the polishing agent, and an additive liquid for polishing for preparing the polishing agent.

2. Background Art

In recent years, along with high integration and high functionality of a semiconductor integrated circuit, a microfabrication technique for realizing miniaturization and high densification of a semiconductor device is under development. Conventionally, in the production of a semiconductor integrated circuit device (hereinafter, sometimes referred to as "semiconductor device"), an inter-level dielectric film, an embedded interconnection, etc. have been planarized using a chemical mechanical polishing (hereinafter, referred to as CMP) method so as to prevent a problem that, for example, unevenness (difference in level) on the layer surface exceeds the depth of focus of lithography and sufficient resolution is not obtained. As the requirement for high refinement or miniaturization of a device becomes stricter, the importance of advanced planarization using CMP is more increasing.

Furthermore, in the production of a semiconductor device, Shallow Trench Isolation (hereinafter, referred to as STI) with a small device isolation width has been recently introduced so as to advance more sophisticated miniaturization of a semiconductor device.

The STI is a technique of forming a trench (groove) on a silicon substrate and filling the trench with an insulating film, thereby forming an electrically insulated device region. In the STI, first, as shown in FIG. 1A, after masking a device region of a silicon substrate 1 with a silicon nitride film 2, etc., a trench 3 is formed on the silicon substrate 1, and an insulating film such as silicon dioxide film 4 is deposited thereof so as to fill the trench 3. Subsequently, the silicon dioxide film 4 on the silicon nitride film 2 as a convex part is polished and removed by CMP while leaving the silicon dioxide film 4 in the trench 3 as a concave part, whereby a device isolation structure in which, as shown in FIG. 1B, the silicon dioxide film 4 is embedded in the trench 3 is obtained.

In the CMP in such STI, when the silicon nitride film is exposed, polishing can be stopped from progressing by increasing the selection ratio of the silicon dioxide film to the silicon nitride film (i.e., the ratio of the polishing rate of silicon dioxide film to the polishing rate of silicon nitride film; hereinafter, sometimes simply referred to as "selection ratio"). In the polishing method using a silicon nitride film as a stopper film like this, a smoother surface can be obtained than the case of using the normal polishing method.

Thus, in the recent CMP technique, not only a high polishing rate for a silicon dioxide film is required in view of cost, but also a high selection ratio is important.

A method for improving polishing properties of a polishing agent has been proposed. Patent Document 1 discloses a polishing agent for a base material of a silicon-containing dielectric material, wherein the polishing agent contains, as an abrasive grain, a cerium oxide grain, etc. and contains at least one additive selected from an arylamine, a heterocyclic amine, an aminocarboxylic acid, a cyclic monocarboxylic acid and an unsaturated monocarboxylic acid.

With the polishing agent disclosed in Patent Document 1, the polishing rate of silicon dioxide film may be assured of a high value to a certain extent, but since the polishing rate of silicon nitride film is not sufficiently controlled, the selection ratio of silicon dioxide film to silicon nitride film is not high enough. In turn, the base material obtained has unsatisfactory planarity.

Patent Document 1: JP-T-2006-520530 (the term "JP-T" as used herein means a published Japanese translation of a PCT patent application) (WO2004/069947)

SUMMARY OF THE INVENTION

The present invention has been made to solve the above-described problems, and an object of the present invention is to provide: a polishing agent capable of achieving a high selection ratio and good planarity by keeping low the polishing rate for a silicon nitride film while maintaining a sufficiently high polishing rate for a silicon oxide film such as silicon dioxide film; and a polishing method The polishing agent according to the present invention comprises a particle of a metal oxide, a water-soluble polyamide having a tertiary amino group and/or an oxyalkylene chain in a molecule thereof, an organic acid and water, and having a pH of 7 or less.

In the polishing agent, the water-soluble polyamide preferably has the tertiary amino group in a main chain thereof and/or a side chain thereof. In the polishing agent, the water-soluble polyamide preferably has the oxyalkylene chain in a main chain thereof. In the polishing agent, the water-soluble polyamide is preferably a copolymer obtained from: aminoethylpiperazine and/or a modified polyalkylene glycol; and a lactam. In the polishing agent, the metal oxide is preferably a cerium oxide. In the polishing agent, the organic acid is preferably at least one selected from the group consisting of tetrahydrofuran-2-carboxylic acid, pyrrolidone carboxylic acid, 2-hydroxyisobutyric acid, N-acetylglycine, 2-furancarboxylic acid, iminodiacetic acid and levulinic acid.

In the polishing agent, a content of the water-soluble polyamide is preferably 0.0001 mass % or more and 1 mass % or less. In the polishing agent, a content of the organic acid is preferably 0.005 mass % or more and 2.0 mass % or less. In the polishing agent, the pH is preferably 3 or more and 6 or less. In the polishing agent, an average particle diameter of the particle of the metal oxide is preferably 0.01 μm or more and 0.5 μm or less. In the polishing agent, a content of the particle of the metal oxide is preferably 0.05 mass % or more and 2 mass % or less.

The polishing method according to the present invention includes bringing a surface to be polished and a polishing pad into contact with each other while supplying the polishing agent according to any one of claims 1 to 11, thereby performing polishing by relative movement between the surface to be polished and the polishing pad, wherein the surface to be polished which includes a face comprising silicon oxide of a semiconductor substrate is polished.

The additive liquid for polishing according to the present invention, which is to be added to a dispersion liquid of a particle of a metal oxide to prepare a polishing agent, the additive liquid comprising a water-soluble polyamide having a tertiary amino group and/or an oxyalkylene chain in a molecule thereof, an organic acid and water, and having a pH of 7 or less.

In the additive liquid for polishing, the water-soluble polyamide preferably has at least one of the tertiary amino group bonded to a main chain thereof or side chain thereof and the oxyalkylene chain bonded to the main chain. In the additive liquid for polishing, the water-soluble polyamide is preferably a copolymer obtained from: aminoethylpiperazine and/or a modified polyalkylene glycol; and a lactam.

The "surface to be polished" as used in the present disclosure means a face to be polished, for example, a surface, of a target to be polished. In the present disclosure, the "surface to be polished" encompasses an intermediate-stage surface appearing on the semiconductor substrate in the course of producing a semiconductor device.

Furthermore, in the present disclosure, the "silicon oxide" is specifically silicon dioxide but is not limited thereto and includes a silicon oxidation product other than silicon dioxide.

According to the polishing agent and polishing method of the present invention, in the CMP of a surface to be polished which includes a silicon oxide surface in STI, a high selection ratio of silicon oxide to silicon nitride can be achieved by keeping low the polishing rate for a silicon nitride film while maintaining a sufficiently high polishing rate for a silicon oxide film.

DETAILED DESCRIPTION OF THE INVENTION

Figure 1A:
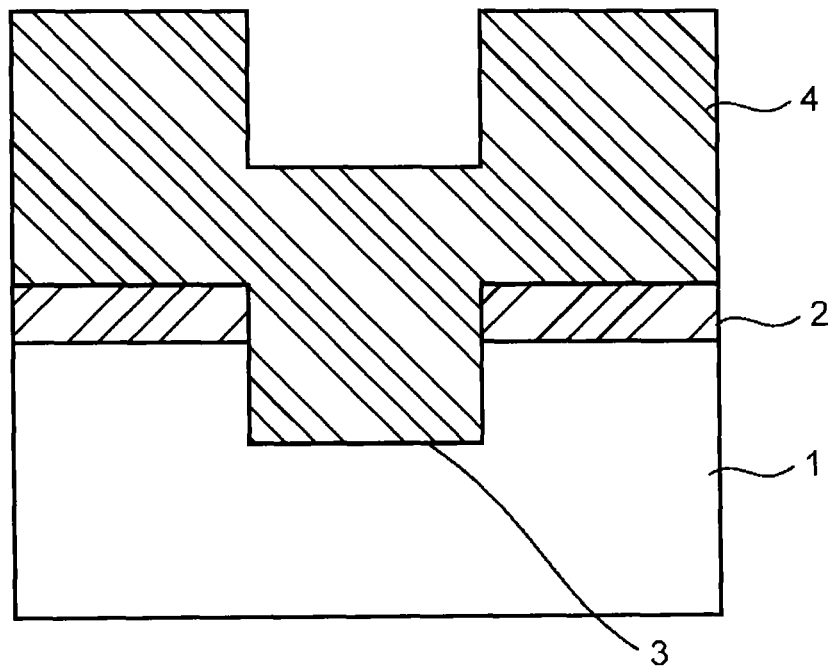
FIG. 1A and FIG. 1B are cross-sectional views of a semiconductor substrate, illustrating the method of polishing by CMP in STI.
Figure 1B:
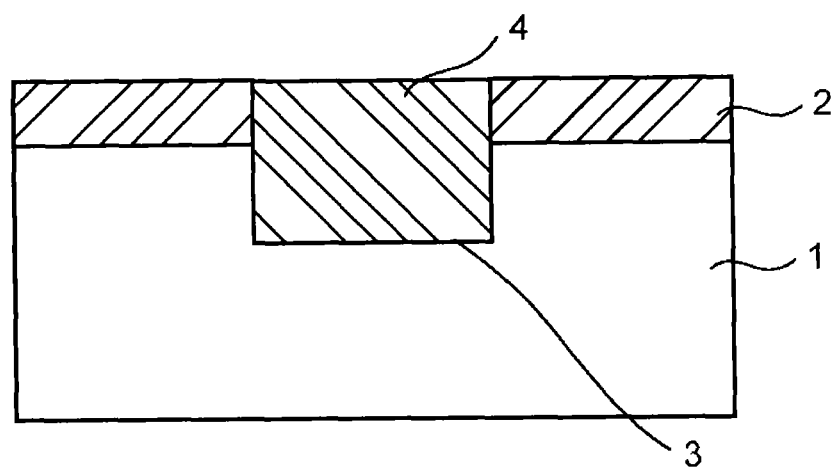

The exemplary embodiments in the present invention are described below. The present invention is not limited to the following embodiments, and other embodiments also belong to the category of the present invention as long as they meet the gist of the present invention.

<Polishing Agent>

The polishing agent in the present invention contains a metal oxide particle, a water-soluble polyamide having, in the molecule, at least one of a tertiary amino group and an oxyalkylene chain, an organic acid, and water and has a pH of 7 or less.

In the case where the polishing agent in the present invention is used, for example, for CMP of a surface to be polished which includes a silicon oxide film (e.g., silicon dioxide film) in STI, the polishing agent has a high polishing rate for the silicon oxide film and moreover, has a sufficiently low polishing rate for a silicon nitride film, so that a high selection ratio of a silicon oxide film to a silicon nitride film can be achieved. In turn, polishing for high planarity can be realized.

The mechanism by which the polishing agent in the present invention exerts such excellent polishing properties is not clearly known but is believed to occur by virtue of containing both a water-soluble polyamide and an organic acid. That is, the mechanism is thought to be caused by the adsorption, in the region of pH 7 or less, of the water-soluble polyamide and a carboxyl group contained in the organic acid to the surface of an inorganic oxide particle such as cerium oxide as well as the surface to be polished which includes a silicon oxide film. It is considered that as a result of optimization of the effects of adsorption to the metal oxide particle surface and adsorption to the surface to be polished which includes a silicon oxide film, both a high polishing rate for the silicon oxide film and a high selection ratio of the silicon oxide film to a silicon nitride film are obtained without impairing the dispersibility of the metal oxide particle.

Each of the components contained in the polishing agent in the present invention and the pH of the liquid are described below.

(Metal Oxide Particle)

The metal oxide particle contained in the polishing agent in the present invention has a function as a polishing abrasive grain. Examples of the metal oxide particle include a particle of a metal oxide selected from the group consisting of cerium oxide, alumina, silica, titania and zirconia. The metal oxide is preferably cerium oxide in view of its high polishing rate for a silicon oxide film.

In the case of using a cerium oxide particle as the metal oxide particle in the polishing agent in the present invention, the cerium oxide particle contained is not particularly limited, but a cerium oxide particle produced, for example, by the method described in JP-A-11-12561 or JP-A-2001-35818 may be used. That is, a cerium oxide particle obtained by adding an alkali to an aqueous cerium(IV) ammonium nitrate solution to prepare a cerium hydroxide gel and subjecting the gel to filtration, washing and firing, or a cerium oxide particle obtained by grinding high-purity cerium carbonate and subjecting the ground product to firing, pulverization and classification, may be used. In addition, a cerium oxide particle obtained by, as described in JP-T-2010-505735, chemically oxidizing a cerium(III) salt in a liquid may also be used.

The average particle diameter of the metal oxide particle is preferably 0.01 µm or more and 0.5 µm or less, more preferably 0.03 µm or more and 0.3 µm or less. If the average particle diameter exceeds 0.5 µm, a polishing flaw such as scratch may be generated on the surface to be polished. If the average particle diameter is less than 0.01 µm, not only the polishing rate may decrease, but also since the proportion of the surface area per unit volume is large, the particle is susceptible to the surface state and is likely to undergo aggregation depending on the conditions such as pH and additive concentration.

The metal oxide particle like the above-described cerium oxide particle exists as an aggregate particle (secondary particle) resulting from aggregation of primary particles in a liquid and therefore, the preferable particle diameter of the metal oxide particle is expressed by the average particle diameter. The average particle diameter is measured using a dispersion liquid dispersed in a dispersion medium such as pure water and using a particle size distribution meter such as laser diffraction-scattering system.

The content ratio (concentration) of the metal oxide particle is preferably 0.05 mass % or more and 2.0 mass % or less, more preferably 0.15 mass % or more and 0.5 mass % or less, based on the total mass of the polishing agent.

When the content ratio of the metal oxide particle is 0.05 mass % or more and 2.0 mass % or less, a sufficiently high polishing rate for a silicon oxide film is obtained. In addition, the polishing agent is kept from an excessive increase in the viscosity and allows for good handling.

A metal oxide particle in a state of being previously dispersed in a medium (hereinafter, referred to as "metal oxide particle dispersion liquid") may also be used. As the medium, water may be preferably used.

(Water)

In the polishing agent in the present invention, water is contained as a medium for dispersing the metal oxide particle therein, and for dissolving the later-described water-soluble polyamide, etc. The kind of water is not particularly limited, but, for example, pure water, ultrapure water, or ion-exchanged water is preferably used in consideration of the effect on the water-soluble polyamide, etc., prevention of mixing of impurities, and effect on pH, etc.

(Water-Soluble Polyamide)

The water-soluble polyamide contained in the polishing agent of the present invention is a polyamide having, in the molecule, a tertiary amino group and/or an oxyalkylene chain and having water solubility. The "water-soluble" as used herein means a property of being dissolved in water at ordinary temperature.

The water-soluble polyamide for use in the present invention is imparted with water-solubility by the tertiary amino group and/or oxyalkylene chain existing in the molecule. The tertiary amino group may be introduced into the main chain of the polyamide, may be bonded to the side chain, or may be bonded to both the main chain and the side chain. The oxyalkylene chain is preferably introduced into the main chain of the polyamide.

As the monomer compound for introducing a tertiary amino group into the main chain of the polyamide, examples thereof include aminoethylpiperazine, bisaminopropylpiperazine, etc. As the monomer compound for introducing a tertiary amino group into the side chain of the polyamide, examples thereof include α-dimethylamino-ϵ-caprolactam, etc. Hereinafter, the monomer compound for introducing a tertiary amino group into the main chain or side chain of the polyamide may be referred to as "amino group-introducing monomer".

As the monomer compound for introducing an oxyethylene chain into the main chain of the polyamide, examples thereof include a modified polyalkylene glycol obtained by modifying both ends of a polyalkylene glycol with a diamine or a dicarboxylic acid. As the polyalkylene glycol modified with the diamine, examples thereof include bis-aminopropyl polyethylene glycol. As the polyalkylene glycol modified with the dicarboxylic acid, examples thereof include bis-carboxy polyethylene glycol.

In the case of using a modified polyalkylene glycol in which both ends are modified with a diamine, a dicarboxylic acid in an amount substantially equimolar thereto is preferably used. Examples of the dicarboxylic acid include adipic acid, sebacic acid, dodecanedicarboxylic acid, terephthalic acid, and isophthalic acid, etc. In the case of using a modified polyalkylene glycol in which both ends are modified with a dicarboxylic acid, a diamine in an amount substantially equimolar thereto is preferably used. Examples of the diamine include an aliphatic diamine such as hexamethylenediamine, methylpentadiamine and nonanediamine, an alicyclic diamine such as p-aminocyclohexylmethane, and an aromatic diamine such as metaxylylenediamine.

The water-soluble polyamide is obtained by polymerizing singularly the amino group-introducing monomer or the modified polyalkylene glycol or by copolymerizing both of them, but a water-soluble polyamide obtained by copolymerization where lactams are further added is preferred. That is, a water-soluble polyamide obtained by copolymerizing at least one of the amino group-introducing monomer and the modified polyalkylene glycol with lactams is preferred, and a water-soluble polyamide obtained by copolymerizing the amino group-introducing monomer, the modified polyalkylene glycol and lactams is more preferred.

Examples of the lactams include ϵ-caprolactam, propionelactam, heptanelactam, capryllactam, undecanelactam, lauryllactam, etc.

Preferable examples of the water-soluble polyamide include a copolymer obtained from aminoethylpiperazine and/or modified polyalkylene glycol, and a lactam.

Examples of the commercially available water-soluble polyamide includes, for example, the water-soluble nylon (trade name: "AQ NYLON") produced by Toray Industries, Inc.

The content ratio (concentration) of the water-soluble polyamide is preferably 0.0001 mass % or more and 1 mass % or less based on the total mass of the polishing agent. The content of the water-soluble polyamide is more preferably 0.00025 mass % or more and 0.1 mass % or less, because in this case, not only a sufficiently high polishing rate for a silicon oxide film but also a high selection ratio are obtained and in turn, the flatness in a pattern is good.

(Organic Acid and/or Salt Thereof)

As the organic acid contained in the polishing agent in the present invention, examples thereof include a carboxylic acid, an organic sulfonic acid, an organic phosphoric acid, etc., and the carboxylic acid is preferred. The carboxylic acid may be either a monocarboxylic acid having one carboxyl group or a polycarboxylic acid having two or more carboxyl groups. Preferable carboxylic acids are exemplified below, but the present invention is not limited thereto.

Carboxylic acid (monocarboxylic acid, polycarboxylic acid) having a heterocyclic ring containing a nitrogen atom (nitrogen-containing heterocyclic ring):

2-Pyridinecarboxylic acid, 3-pyridinecarboxylic acid, 4-pyridinecarboxylic acid, 2,3-pyridinedicarboxylic acid, 2,4-pyridinedicarboxylic acid, 2,5-pyridinedicarboxylic acid, 2,6-pyridinedicarboxylic acid, 3,4-pyridinedicarboxylic acid, 3,5-pyridinedicarboxylic acid, pyrazinecarboxylic acid, 2,3-pyrazinedicarboxylic acid, 2-quinolinecarboxylic acid (quinaldic acid), pyrrolidonecarboxylic acid, DL-pipecolic acid, and 2-indolecarboxylic acid.

Carboxylic acid having a heterocyclic ring containing a heteroatom except for nitrogen:

2-Furancarboxylic acid, 3-furancarboxylic acid, tetrahydrofuran-2-carboxylic acid, and tetrahydrofuran-2,3,4,5-tetracarboxylic acid.

Amino group-containing carboxylic acid (e.g., amino acid):

Alanine, glycine, glycylglycine, aminobutyric acid, N-acetylglycine, N,N-di(2-hydroxyethyl)glycine, N-(tert-butoxycarbonyl)glycine, proline, trans-4-hydroxy-L-proline, phenylalanine, sarcosine, hydantoin acid, creatine, creatine hydrate, N-[tris(hydroxymethyl)methyl]glycine, glutamic acid, aspartic acid, iminodiacetic acid, and N-acetylalanine.

Hydroxyl group-containing carboxylic acid (e.g., hydroxycarboxylic acid):

Lactic acid, malic acid, citric acid, tartaric acid, glycolic acid, gluconic acid, salicylic acid, 2-hydroxyisobutyric acid, glyceric acid, 2,2-bis(hydroxymethyl)propionic acid, and 2,2-bis(hydroxymethyl)butyric acid.

Ketone group-containing carboxylic acid (keto acid):
Pyruvic acid, acetoacetic acid, and levulinic acid.
Saturated hydrocarbon ring (alicyclic hydrocarbon ring)-containing carboxylic acid:
Cyclopentanecarboxylic acid, cyclohexanecarboxylic acid, and cycloheptanecarboxylic acid.
Carboxylic acid other than those described above:
Oxalic acid, malonic acid, succinic acid, fumaric acid, maleic acid, glutaric acid, adipic acid, and phthalic acid.

Among these, more preferable examples of the carboxylic acids include tetrahydrofuran-2-carboxylic acid, 2-furancarboxylic acid, picolinic acid, pyrrolidonecarboxylic acid, N,N-di(2-hydroxyethyl)glycine, N-[tris(hydroxymethyl)methyl]glycine, N-acetylglycine, N-(tert-butoxycarbonyl)glycine, iminodiacetic acid, creatine hydrate, 2-hydroxyisobutyric acid, DL-glyceric acid, 2,2-bis(hydroxymethyl)propionic acid, 2,2-bis(hydroxymethyl)butyric acid, levulinic acid, and acetoacetic acid. Among these, still more preferable examples of the carboxylic acids include tetrahydrofuran-2-carboxylic acid, 2-furancarboxylic acid, pyrrolidonecarboxylic acid, N-acetylglycine, 2-hydroxyisobutyric acid, iminodiacetic acid, and levulinic acid.

The organic acid such as the carboxylic acids recited above may also be used in a salt form. Examples of the salt of the organic acid include an alkali metal salt such as ammonium salt, quaternary ammonium salt and potassium salt, an organic amine salt, etc.

The content ratio (concentration) of the organic acid is preferably 0.005 mass % or more and 2.0 mass % or less based on the entire polishing agent. When the content is in the range above, the effect of improving the polishing rate for a silicon oxide film and enhancing the selection ratio is sufficiently obtained, and the dispersion stability of the metal oxide particle as an abrasive grain is also good. The content ratio of the organic acid is preferably 0.01 mass % or more and 1.5 mass % or less, more preferably 0.01 mass % or more and 0.3 mass % or less, based on the entire polishing agent.

(pH)

The pH of the polishing agent in the present invention is preferably 7 or less. When the pH of the polishing agent is 7 or less, the effect of improving the polishing rate for a silicon oxide film and enhancing the selection ratio is sufficiently obtained, and the dispersion stability of the metal oxide particle as an abrasive grain is also good. The pH of the polishing agent is more preferably 3 or more and 6 or less, still more preferably 3.5 or more and 5.5 or less.

In order to adjust the pH to a predetermined value of 7 or less, the polishing agent in the present invention may contain various inorganic acids or inorganic acid salts as a pH adjusting agent. The inorganic acid or inorganic acid salt is not particularly limited, but examples thereof include a nitric acid, a sulfuric acid, a hydrochloric acid, a phosphoric acid, and ammonium salts or potassium salts thereof. Furthermore, in the polishing agent in the present invention, various basic compounds may be added as a pH adjusting agent. The basic compound is preferably water-soluble but is not particularly limited. As the basic compound, examples thereof include ammonia, potassium hydroxide, a quaternary ammonium hydroxide such as tetramethylammonium hydroxide (hereinafter, referred to as TMAH) and tetraethylammonium hydroxide, and an organic amine such as monoethanolamine (hereinafter, referred to as MEA) and ethylenediamine, etc.

In addition to the components described above, the polishing agent in the present invention may contain a dispersant. The dispersant is contained so as to stably disperse an inorganic oxide particle such as cerium oxide particle in a dispersion medium such as pure water. Examples of the dispersant include anionic surfactants, cationic surfactants, nonionic surfactants and amphoteric surfactants, and anionic polymer compounds, cationic polymer compounds, nonionic polymer compounds and amphoteric polymer compounds, and one member or two or more members thereof may be incorporated. In addition, the polishing agent in the present invention may appropriately contain a lubricant, a tackifier or viscosity adjuster, an antiseptic, etc., if desired.

For the convenience of storage or transportation of the polishing agent in the present invention, a metal oxide particle dispersion liquid (hereinafter, referred to as "dispersion liquid A") and an aqueous solution prepared by dissolving the water-soluble polyamide and the organic acid in water (hereinafter, referred to as "aqueous solution B") may be separately prepared as two liquids, and these liquids may be mixed when it is used. This aqueous solution B is the later-described additive liquid for polishing.

<Additive Liquid for Polishing>

The additive liquid for polishing in the present invention is an additive liquid for preparing a polishing agent by adding it to a metal oxide particle dispersion liquid, and the additive liquid contains a water-soluble polyamide having a tertiary amino group and/or an oxyalkylene chain in the molecule, an organic acid and water and has a pH of 7 or less. When a polishing agent is prepared, the convenience of storage or transportation of the polishing agent can be enhanced by employing a method where the additive liquid for polishing is used and added to a metal oxide particle dispersion liquid.

Respective components contained in the additive liquid for polishing in the present invention, i.e., a water-soluble polyamide, an organic solvent and water, and the pH of the liquid are the same as those described for respective components contained in the polishing agent and the pH of the liquid.

In the additive liquid for polishing in the present invention, the content ratio (concentration) of the water-soluble polyamide is preferably 0.0002 mass % or more and 10 mass % or less, more preferably 0.001 mass % or more and 1 mass % or less, still more preferably 0.005 mass % or more and 0.5 mass % or less, based on the entire additive liquid.

In the additive liquid for polishing in the present invention, the content ratio of the organic acid is preferably 0.02 mass % or more and 30 mass % or less, more preferably 0.1 mass % or more and 20 mass % or less, still more preferably 0.5 mass % or more and 10 mass % or less, based on the entire additive liquid.

The pH of the additive liquid is preferably 7 or less, more preferably 3 or more and 6 or less.

In the metal oxide particle dispersion liquid to which the additive liquid is added, the content ratio of the metal oxide particle in the liquid is preferably 0.2 mass % or more and 40 mass % or less, more preferably 1 mass % or more and 20 mass % or less, still more preferably 5 mass % or more and 10 mass % or less.

By adding the additive liquid for polishing in the present invention to the metal oxide particle dispersion liquid, a polishing agent capable of achieving a high selection ratio and high flatness by keeping low the polishing rate for a silicon nitride film while maintaining a high polishing rate for a silicon oxide film can be obtained.

In the case of preparing a polishing agent by mixing two separate liquids, i.e., the metal oxide particle dispersion liquid (dispersion liquid A) and the additive liquid for polishing in the present invention, the liquids may be concentrated such that the concentration of the metal oxide particle in the dispersion liquid A and the concentrations of the water-soluble polyamide and organic acid in the additive liquid for polishing are from 2 to 100 times higher than the concentrations when the polishing agent is used, and be diluted to predetermined concentrations when it is used. More specifically, for example, in the case where the liquids are concentrated to 10 times as to all of the concentration of the metal oxide particle in the dispersion liquid A and the concentrations of the water-soluble polyamide and organic acid in the additive liquid, 10 parts by mass of the dispersion liquid A, 10 parts by mass of the additive liquid and 80 parts by mass of water are mixed and stirred, and the resulting mixture is used as the polishing agent.

<Preparation Method of Polishing Agent>

For preparing the polishing agent in the present invention, a method where the water-soluble polyamide and the organic acid are added to a dispersion liquid obtained by dispersing the above-described metal oxide particle in water such as pure water or ion-exchanged water, followed by mixing is used. After the mixing, the mixture is stirred for a predetermined time by using a stirrer, etc., whereby a uniform polishing agent is obtained. Alternatively, after the mixing, the mixture may be treated in an ultrasonic disperser to obtain a better dispersion state.

The polishing agent in the present invention need not necessarily be supplied to the polishing site after previously mixing all of the constituent polishing components. The polishing components may be mixed to formulate the composition of the polishing agent when it is supplied to the polishing site.

For the convenience of storage or transportation of the polishing agent in the present invention, a metal oxide particle dispersion liquid (hereinafter, referred to as "dispersion liquid A") and an aqueous solution prepared by dissolving the water-soluble polyamide and the organic acid in water (hereinafter, referred to as "aqueous solution B") may be separately prepared as two liquids, and these liquids may be mixed when it is used. This aqueous solution B is the above-described additive liquid for polishing. In the case of separately preparing two liquids, i.e., the dispersion liquid A and the aqueous solution B, and mixing these liquids to prepare a polishing agent, the aqueous solution B may be concentrated such that the concentrations of the water-soluble polyamide and the organic acid are, for example, about 10 times higher than those when the polishing agent is used, and after mixing, the mixture may be diluted to a predetermined concentration and used.

<Polishing Method>

The polishing method according to the embodiment in the present invention is a method of bringing a surface to be polished of a target to be polished into contact with a polishing pad while supplying the above-described polishing agent, and performing polishing by relative movement between those two members. Here, the surface to be polished subjected to polishing is, for example, a surface including a face including silicon dioxide of a semiconductor substrate. Preferred examples of the semiconductor substrate include a substrate for the above-described STI. The polishing agent in the present invention is effective also for polishing so as to planarize an inter-level dielectric film between multilayer interconnections in the production of the semiconductor device.

As the silicon dioxide film in a substrate for STI, examples thereof include a so-called PE-TEOS film deposited by a plasma CVD method using tetraethoxysilane (TEOS) as a raw material. In addition, as the silicon dioxide film, examples thereof include a so-called HDP film deposited by a high-density plasma CVD method. As the silicon nitride film, examples thereof include a film deposited by a low-pressure CVD method or plasma CVD method using silane or dichlorosilane and ammonia as raw materials.

A single film is deposited.

Polishing is performed by the above-described method using the polishing agent of the present invention, whereby advanced planarization can be realized. The planarity is evaluated using a pattern wafer for STI. Polishing of the pattern for STI is preferably stopped when the silicon nitride film is exposed, and in the case where the silicon nitride film of the pattern wafer is less abradable, this is more advantageous in view of planarity. Accordingly, the amount of thickness reduction of the silicon nitride film can be used as an indicator of planarity. A smaller amount of thickness reduction of the silicon nitride film means better planarity.

Figure 2:
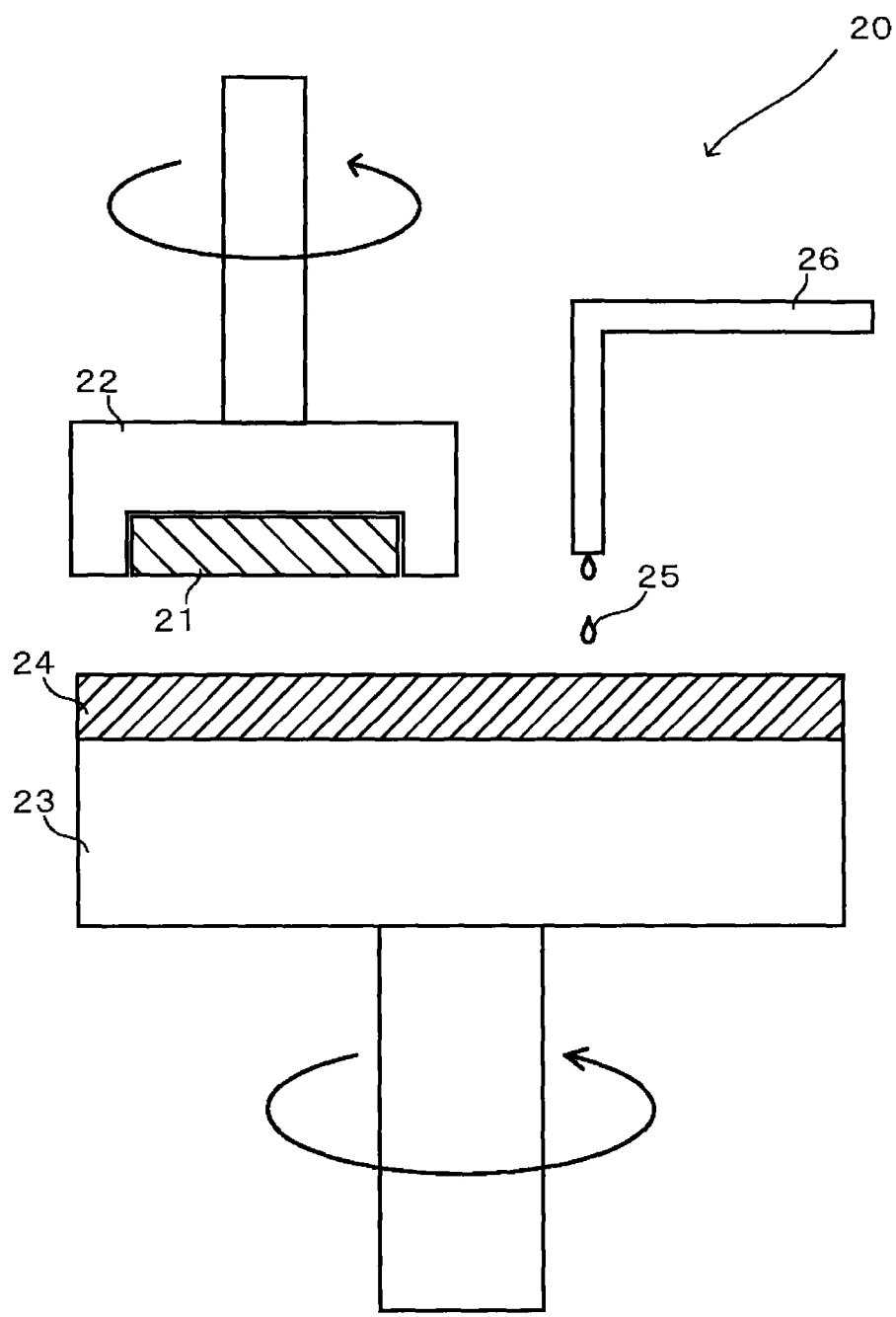
FIG. 2 is a view illustrating an example of the polishing apparatus that can be used for the polishing method in the present invention.

For the polishing method in the embodiment in the present invention, a conventional polishing apparatus can be used. FIG. 2 is a view illustrating an example of the polishing apparatus that can be used in the polishing method in the present invention.

The polishing apparatus 20 has a polishing head 22 for holding a semiconductor substrate 21 such as STI substrate, a polishing platen 23, a polishing pad 24 attached to a surface of the polishing platen 23, and a polishing agent supply pipe 26 for supplying a polishing agent 25 to the polishing pad 24. The apparatus is configured to bring the surface to be polished of the semiconductor substrate 21 held in the polishing head 22 into contact with the polishing pad 24 while supplying the polishing agent 25 from the polishing agent supply pipe 26 and perform polishing by relative rotational movement between the polishing head 22 and the polishing platen 23. The polishing apparatus to be used in the embodiment in the present invention is not limited to such a structure.

The polishing head 22 may perform not only rotational movement but also linear movement. In addition, the polishing platen 23 and the polishing pad 24 may have a size equivalent to or smaller than that of the semiconductor substrate 21. In this case, the polishing head 22 and the polishing platen 23 are preferably moved relatively so that the entire surface of the surface to be polished of the semiconductor substrate 21 can be polished. Furthermore, the polishing platen 23 and the polishing pad 24 may not perform rotational movement and may move, for example, in one direction by a belt system.

The polishing conditions of the polishing apparatus 20 are not particularly limited, but the polishing head 22 is pressed against the polishing pad 24 by applying a load, whereby the polishing pressure can be more increased and the polishing rate can be enhanced. The polishing pressure is preferably about 0.5 to 50 kPa, and is more preferably about 3 to 40 kPa in view of uniformity of the polishing rate on the surface to be polished of the semiconductor substrate 21, flatness and prevention of a polishing defect such as scratch. The rotation speed of the polishing platen 23 and the polishing head 22 is preferably about 50 to 500 rpm, but the present invention is not limited thereto. The supply amount of the polishing agent 25 is appropriately adjusted according to the composition of polishing agent, the above-described polishing conditions, etc.

As the polishing pad 24, a pad made of a nonwoven fabric, a pad made of a foamed polyurethane, a pad made of a porous resin, a pad made of a nonporous resin, etc. may be used. In order to accelerate the supply of the polishing agent 25 to the polishing pad 24 or allow a certain amount of the polishing agent 25 to stay on the polishing pad 24, the surface of the polishing pad 24 may be processed to form a groove, for example, in a lattice-like, concentric or spiral manner. In addition, a pad conditioner may be brought into contact with the surface of the polishing pad 24, if desired, to perform polishing while conditioning the surface of the polishing pad 24.

According to the polishing method in the present invention, in a CMP treatment such as planarization of an inter-level dielectric film in the production of a semiconductor device or planarization of an insulating film for STI, not only a surface to be polished which includes silicon oxide (e.g., silicon dioxide) can be polished at a high polishing rate but also a high selection ratio of a silicon oxide film to a silicon nitride film can be realized, so that high planarity can be achieved.

EXAMPLES

The present invention is more specifically described below by referring to Examples and Comparative Examples, but the present invention is not limited to these Examples.

Examples 1 to 16 and Examples 20 to 23 are Examples of the present invention and Examples 17 to 19 and Example 24 are Comparative Examples. In Examples, unless otherwise indicated, "%" means mass %. The characteristic values were measured and evaluated by the following methods.

[pH]

The pH was measured by means of pH Meter HM-30R manufactured by DKK-TOA Corporation.

[Average Particle Diameter]

The average particle diameter was measured by means of a laser scattering/diffraction particle size distribution analyzer (device name: LA-950, manufactured by Horiba, Ltd.).

[Polishing Properties]

The polishing properties were measured and evaluated by means of a full automatic CMP polishing apparatus (device name: MIRRA, manufactured by Applied Materials, Inc.). As the polishing pad, a two-layer pad (IC-1400, K-GROOVE, manufactured by Rodel, Inc.) was used, and for the conditioning of polishing pad, a diamond pad conditioner (trade name: A165, manufactured by 3M Company) was used. The polishing conditions were a polishing pressure of 21 kPa, a rotation speed of the polishing platen of 77 rpm, and a rotation speed of the polishing head of 73 rpm. The supply rate of the polishing agent was set to 200 ml/min.

As the target to be polished (material to be polished), a blanket substrate with a silicon dioxide film, in which a silicon dioxide film was deposited on a 8-inch silicon wafer by plasma CVD by using tetraethoxysilane as a raw material, and a blanket substrate with a silicon nitride film, in which a silicon nitride film was deposited on a 8-inch silicon wafer by CVD, were used, respectively.

In addition, for the evaluation of planarity in the polishing, a commercially available STI pattern test substrate (trade name: 864CMP000, manufactured by International SEMATECH Inc.) was used as the material to be polished. In this pattern substrate, concave-convex patterns simulating an STI pattern were formed on a 8-inch silicon wafer. The patterns formed are respectively a line-and-space pattern where a concave part and a convex part are alternately formed by changing the width of each part in the range of 0.5 to 500 μm, and a stripe pattern where the sum of widths of a concave part and a convex part is 100 μm and the width of the convex part is changed in the range of 10 to 90 μm.

The thickness of the silicon nitride film formed as a polishing stopping layer on the convex part is 90 nm, and the depth of the trench is 350 nm. In addition, the entire surface of the pattern substrate is covered with a silicon dioxide film having a thickness of 500 nm, which was deposited by plasma CVD using tetraethoxysilane as a raw material.

For the measurement of film thickness of the silicon dioxide film and silicon nitride film deposited on the blanket substrate and pattern substrate, a thickness meter, UV-1280SE, manufactured by KLA-Tencor Corp. was used. The polishing rate for each of the silicon dioxide film and the silicon nitride film was calculated by determining the difference between the film thickness before polishing of the blanket substrate and the film thickness after polishing for 1 minute. The average value (nm/min) of the polishing rate, obtained from the polishing rates at 49 points in a plane of the substrate, was used as an indicator for evaluation of the polishing rate.

Furthermore, the ratio between the polishing rate for a silicon dioxide film and the polishing rate for a silicon nitride film (polishing rate for silicon dioxide film/polishing rate for silicon nitride film) was calculated as a selection ratio.

Example 1

A cerium oxide dispersion liquid obtained by dispersing cerium oxide particles having an average particle diameter of 0.12 μm in pure water (hereinafter, referred to as Cerium Oxide Dispersion Liquid a) was added to pure water so as to afford a cerium oxide particle concentration of 0.10% based on the total mass of the polishing agent and thereafter, AQ NYLON T-70 (trade name, produced by Toray Industries, Inc. (hereinafter, referred to as Water-Soluble Polyamide A) was added so as to afford the concentration of 0.0020% and tetrahydrofuran-2-carboxylic acid as an organic acid was added so as to afford the concentration of 0.10%, respectively. After stirring, the pH was adjusted to 4.0 by further adding KOH, thereby obtaining Polishing Agent (1).

Examples 2 to 4

The same Cerium Oxide Dispersion Liquid a as in Example 1, Water-Soluble Polyamide A and tetrahydrofuran-2-carboxylic acid were added to pure water so as to afford the concentrations shown in Table 1, respectively, and after stirring, the pH was adjusted to the values shown in Table 1 by further adding KOH, thereby obtaining Polishing Agents (2) to (4).

Example 5

The same Cerium Oxide Dispersion Liquid a as in Example 1, AQ NYLON P-95 (trade name, produced by Toray Industries, Inc.) (hereinafter referred to as Water-Soluble Polyamide B) and tetrahydrofuran-2-carboxylic acid were added to pure water so as to afford the concentrations shown in Table 1, respectively, and after stirring, the pH was adjusted to the value shown in Table 1 by further adding KOH, thereby obtaining Polishing Agent (5).

Example 6

A cerium oxide dispersion liquid obtained by dispersing cerium oxide particles having an average particle diameter of 0.18 μm in pure water (hereinafter, referred to as Cerium Oxide Dispersion Liquid b) was added to pure water so as to afford a cerium oxide particle concentration of 0.10% based on the total mass of the polishing agent and thereafter, Water-Soluble Polyamide A and tetrahydrofuran-2-carboxylic acid were added to pure water so as to afford the concentrations shown in Table 1, respectively. After stirring, the pH was adjusted to 4.0 by further adding monoethanolamine (hereinafter referred to as MEA), thereby obtaining Polishing Agent (6).

Examples 7 and 8

The Cerium Oxide Dispersion Liquid b, Water-Soluble Polyamide A or B shown in Table 1 and tetrahydrofuran-2-carboxylic acid were added to pure water so as to afford the concentrations shown in Table 1, respectively, and after stirring, the pH was adjusted to the values shown in Table 1 by further adding KOH or MEA shown in Table 1, thereby obtaining Polishing Agents (7) and (8).

Examples 9 to 16

The Cerium Oxide Dispersion Liquid a, Water-Soluble Polyamide A or B shown in Table 1 and the organic acid shown in Table 1 were added to pure water so as to afford the concentrations shown in Table 1, respectively, and after stirring, the pH was adjusted to 4.0 by further adding KOH, thereby obtaining Polishing Agents (9) to (16).

Example 17

The Cerium Oxide Dispersion Liquid a and sarcosine as an organic acid were added to pure water so as to afford the concentrations shown in Table 1, respectively, and after stirring, the pH was adjusted to 4.0 by further adding nitric acid, thereby obtaining Polishing Agent (17).

Example 18

The Cerium Oxide Dispersion Liquid a and Water-Soluble Polyamide A were added to pure water so as to afford the concentrations shown in Table 1, respectively, and after stirring, the pH was adjusted to 4.0 by further adding nitric acid, thereby obtaining Polishing Agent (18).

Example 19

The Cerium Oxide Dispersion Liquid a and benzoic acid as an organic acid were added to pure water so as to afford the concentrations shown in Table 1, respectively, and after stirring, the pH was adjusted to 5.0 by further adding KOH, thereby obtaining Polishing Agent (19).

The polishing properties (polishing rate for silicon dioxide film, polishing rate for silicon nitride film, and selection ratio) of each of Polishing Agents (1) to (19) obtained in Examples 1 to 19 were measured by the methods described above. In the measurement of the polishing properties, each of a blanket substrate with a silicon dioxide film and a blanket substrate with a silicon nitride film was used as the target to be polished (material to be polished). The measurement results are shown in Table 1.

TABLE 1

| | Average particle diameter of cerium oxide (μm) | Concentration of cerium oxide (wt %) | Kind of water-soluble polyamide | Concentration of water-soluble polyamide (wt %) | Kind of organic acid | Concentration of organic acid (wt %) | pH Adjusting agent | pH | Polishing rate for silicon oxide film (nm/min) | Polishing rate for silicon nitride film (nm/min) | Selection ratio |
|---|---|---|---|---|---|---|---|---|---|---|---|
| Ex. 1 | 0.12 | 0.10% | A | 0.0020% | tetrahydrofuran-2-carboxylic acid | 0.10% | KOH | 4.0 | 114 | 0.6 | 195 |
| Ex. 2 | 0.12 | 0.50% | A | 0.0001% | tetrahydrofuran-2-carboxylic acid | 0.10% | KOH | 3.0 | 263 | 3.6 | 74 |
| Ex. 3 | 0.12 | 0.50% | A | 0.0020% | tetrahydrofuran-2-carboxylic acid | 0.10% | KOH | 5.0 | 3518 | 9.8 | 359 |
| Ex. 4 | 0.12 | 0.05% | A | 0.0020% | tetrahydrofuran-2-carboxylic acid | 0.50% | KOH | 6.0 | 97 | 3.0 | 32 |
| Ex. 5 | 0.12 | 0.50% | B | 0.10% | tetrahydrofuran-2-carboxylic acid | 0.10% | KOH | 4.3 | 2830 | 11.0 | 258 |
| Ex. 6 | 0.18 | 0.10% | A | 0.0010% | tetrahydrofuran-2-carboxylic acid | 0.05% | MEA | 4.0 | 874 | 5.0 | 175 |
| Ex. 7 | 0.18 | 0.20% | A | 0.0010% | tetrahydrofuran-2-carboxylic acid | 0.01% | KOH | 4.0 | 2495 | 4.0 | 624 |
| Ex. 8 | 0.18 | 0.50% | B | 1.00% | tetrahydrofuran-2-carboxylic acid | 0.07% | MEA | 4.1 | 720 | 4.5 | 161 |
| Ex. 9 | 0.12 | 0.25% | A | 0.0020% | 2-hydroxyisobutyric acid | 0.18% | KOH | 4.0 | 1091 | 16.0 | 68 |
| Ex. 10 | 0.12 | 0.25% | A | 0.0020% | N-acetylglycine | 0.20% | KOH | 4.0 | 2035 | 6.0 | 339 |
| Ex. 11 | 0.12 | 0.25% | A | 0.0020% | pyrrolidone-carboxylic acid | 0.22% | KOH | 4.0 | 3600 | 5.7 | 626 |
| Ex. 12 | 0.12 | 0.25% | A | 0.0020% | levulinic acid | 1.50% | KOH | 4.0 | 1006 | 6.2 | 161 |
| Ex. 13 | 0.12 | 2.0% | B | 0.10% | levulinic acid | 0.50% | KOH | 4.0 | 2994 | 14.0 | 214 |
| Ex. 14 | 0.12 | 0.25% | A | 0.0020% | acetoacetic acid | 0.05% | KOH | 4.0 | 2109 | 6.0 | 352 |
| Ex. 15 | 0.12 | 0.25% | A | 0.0020% | 2-furancarboxylic acid | 0.05% | KOH | 4.0 | 2146 | 5.0 | 429 |
| Ex. 16 | 0.12 | 0.25% | A | 0.0020% | iminodiacetic acid | 0.05% | KOH | 4.0 | 2324 | 5.0 | 465 |
| Ex. 17 | 0.12 | 0.25% | — | — | sarcosine | 0.15% | nitric acid | 4.0 | 250 | 51.3 | 5 |
| Ex. 18 | 0.12 | 0.50% | A | 0.10% | — | — | nitric acid | 4.0 | 3 | 1.4 | 2 |
| Ex. 19 | 0.12 | 0.25% | — | — | benzoic acid | 0.10% | KOH | 5.0 | 276 | 72.0 | 4 |

From the results shown in Table 1, the followings are found. Namely, it is found that when polishing is performed using Polishing Agents (1) to (16) of Examples 1 to 16 containing a cerium oxide particle, a water-soluble polyamide having a tertiary amino group and/or an oxyalkylene chain, an organic acid, and water and having a pH of 7 or less, a high polishing rate for a silicon dioxide film is obtained, and the selection ratio of a silicon dioxide film to a silicon nitride film is very high.

On the other hand, it is found that when Polishing Agents (17) and (19) of Examples 17 and 19 not containing a water-soluble polyamide having a tertiary amino group and/or an oxyalkylene chain and Polishing Agent (18) of Example 18 containing the water-soluble polyamide but not containing an organic acid are used, the selection ratio of a silicon dioxide film to a silicon nitride film is significantly low, as compared with the cases of Examples 1 to 16.

Next, it was confirmed that when a pattern substrate as a target to be polished (material to be polished) is polished using Polishing Agents (7), (9) to (11) and (15) to (17) obtained in Examples 7, 9 to 11 and 15 to 17 and Polishing Agents (20) to (24) obtained in Examples 20 to 24 below and the concentration of each component in the polishing agent and the pH of the polishing agent are set to more preferable ranges, the amount of thickness reduction of the silicon nitride film as a polishing stopping layer can be small.

The pattern substrate was polished by the above-described method by using Polishing Agents (7), (9) to (11) and (15) to (17) obtained in Examples 7, 9 to 11 and 15 to 17 and Polishing Agents (20) to (24) obtained in Examples 20 to 24, and the polishing properties were measured and evaluated. In the case of polishing using Polishing Agent (17), the supply rate of the polishing agent was set to 80 ml/min.

In the measurement and evaluation of the polishing properties, the pattern substrate was polished until the silicon nitride film was exposed in a stripe pattern having a convex part width of 70 μm in the region where the sum of widths of a concave part and a convex part is 100 μm, and polishing for 15 seconds was further added. With respect to the pattern substrate after polishing, the thickness of the silicon nitride film on the convex part in a line-and-space pattern where the concave part and the convex part have a width of 50 μm, was measured by the method described above. The amount of thickness reduction of the silicon nitride film was calculated by comparing the difference from the thickness before polishing of the silicon nitride film. The results are shown in Table 2.

The amount of thickness reduction of the silicon nitride film can be used as the indicator for evaluation of the planarity of the substrate after polishing.

TABLE 2

| | Average particle diameter of cerium oxide (μm) | Concentration of cerium oxide (mass %) | Kind of water-soluble polyamide | Concentration of water-soluble polyamide (mass %) | Kind of organic acid | Concentration of organic acid (mass %) | pH Adjusting agent | pH | Amount of thickness reduction of silicon nitride film (nm) |
|---|---|---|---|---|---|---|---|---|---|
| Ex. 7 | 0.18 | 0.20% | A | 0.0010% | tetrahydrofuran-2-carboxylic acid | 0.01% | KOH | 4.0 | 24 |
| Ex. 9 | 0.12 | 0.25% | A | 0.0020% | 2-hydroxyisobutyric acid | 0.18% | KOH | 4.0 | 12 |
| Ex. 10 | 0.12 | 0.25% | A | 0.0020% | N-acetylglycine | 0.20% | KOH | 4.0 | 6 |
| Ex. 11 | 0.12 | 0.25% | A | 0.0020% | pyrrolidonecarboxylic acid | 0.22% | KOH | 4.0 | 5 |
| Ex. 15 | 0.12 | 0.25% | A | 0.0020% | 2-furancarboxylic acid | 0.05% | KOH | 4.0 | 5 |
| Ex. 16 | 0.12 | 0.25% | A | 0.0020% | iminodiacetic acid | 0.05% | KOH | 4.0 | 5 |
| Ex. 17 | 0.12 | 0.25% | — | — | sarcosine | 0.15% | nitric acid | 4.0 | 43 |
| Ex. 20 | 0.12 | 0.50% | A | 0.00025% | tetrahydrofuran-2-carboxylic acid | 0.10% | KOH | 3.5 | 7 |
| Ex. 21 | 0.12 | 0.15% | A | 0.0020% | tetrahydrofuran-2-carboxylic acid | 0.05% | KOH | 4.0 | 23 |
| Ex. 22 | 0.18 | 0.50% | B | 0.10% | tetrahydrofuran-2-carboxylic acid | 0.10% | KOH | 5.1 | 17 |
| Ex. 23 | 0.18 | 0.20% | A | 0.0005% | tetrahydrofuran-2-carboxylic acid | 0.025% | MEA | 4.0 | 6 |
| Ex. 24 | 0.12 | 0.50% | A | 0.0010% | — | — | nitric acid | 4.0 | 40 |

Examples 20 to 23

The Cerium Oxide Dispersion Liquid a or b, Water-Soluble Polyamide A or B and the organic acid shown in Table 2 were added to pure water so as to afford the concentrations shown in Table 2, respectively, and after stirring, the pH was adjusted to the values shown in Table 2 by further adding the pH adjusting agent shown in Table 2, thereby obtaining Polishing Agents (20) to (23).

Example 24

The Cerium Oxide Dispersion Liquid a and Water-Soluble Polyamide A were added to pure water so as to afford the concentrations shown in Table 2, respectively, and after stirring, the pH was adjusted to 4.0 by further adding nitric acid to obtain Polishing Agent (24).

From the results shown in Table 2, the followings are found. Namely, it is found that when the cerium oxide particle concentration is from 0.15 to 0.5%, the water-soluble polyamide concentration is from 0.00025 to 0.1%, the organic acid concentration is from 0.01 to 0.22%, and the pH is from 3.5 to 5.1, the amount of thickness reduction of the silicon nitride film as a polishing stopping layer is very small in the case of polishing of a pattern substrate, and the flatness after polishing is more excellent.

On the other hand, it is found that when Polishing Agent (17) of Example 17 not containing a water-soluble polyamide having a tertiary amino group and/or an oxyalkylene chain and Polishing Agent (24) of Example 24 containing the water-soluble polyamide but not containing an organic acid are used, the amount of thickness reduction of the silicon nitride film as a polishing stopping layer is large.

INDUSTRIAL APPLICABILITY

According to the present invention, for example, in the CMP of a surface to be polished which includes a face composed of silicon oxide, a high selection ratio of a silicon oxide film to a silicon nitride film can be achieved by keeping low the polishing rate for a silicon nitride film while keeping a sufficiently high polishing rate for a silicon oxide film. Therefore, the polishing agent and polishing method of the present invention are suitable for planarization of an insulating film for STI in the production of a semiconductor device.

DESCRIPTION OF REFERENCE NUMERALS AND SIGNS

1: Silicon substrate, 2: Silicon nitride film, 3: Trench, 4: Silicon oxide film, 20: Polishing apparatus, 21: Semiconductor substrate, 22: Polishing head, 23: Polishing platen, 24: Polishing pad, 25: Polishing agent, 26: Polishing agent supply pipe

What is claimed is:

1. A polishing agent, comprising a particle of a metal oxide, a water-soluble polyamide having a tertiary amino group and/or an oxyalkylene chain in a molecule thereof, an organic acid and water, and having a pH of 7 or less.

2. The polishing agent according to claim 1, wherein the water-soluble polyamide has the tertiary amino group in a main chain thereof and/or a side chain thereof.

3. The polishing agent according to claim 1, wherein the water-soluble polyamide has the oxyalkylene chain in a main chain thereof.

4. The polishing agent according to claim 1, wherein the water-soluble polyamide is a copolymer obtained from: aminoethylpiperazine and/or a modified polyalkylene glycol; and a lactam.

5. The polishing agent according to claim 1, wherein the metal oxide is a cerium oxide.

6. The polishing agent according to claim 1, wherein the organic acid is at least one selected from the group consisting of tetrahydrofuran-2-carboxylic acid, pyrrolidone carboxylic acid, 2-hydroxyisobutyric acid, N-acetylglycine, 2-furancarboxylic acid, iminodiacetic acid and levulinic acid.

7. The polishing agent according to claim 1, wherein a content of the water-soluble polyamide is 0.0001 mass % or more and 1 mass % or less.

8. The polishing agent according to claim 1, wherein a content of the organic acid is 0.005 mass % or more and 2.0 mass % or less.

9. The polishing agent according to claim 1, wherein the pH is 3 or more and 6 or less.

10. The polishing agent according to claim 1, wherein an average particle diameter of the particle of the metal oxide is 0.01 µm or more and 0.5 µm or less.

11. The polishing agent according to claim 1, wherein a content of the particle of the metal oxide is 0.05 mass % or more and 2 mass % or less.

12. A polishing method, comprising bringing a surface to be polished and a polishing pad into contact with each other while supplying the polishing agent according to claim 1, thereby performing polishing by relative movement between the surface to be polished and the polishing pad, wherein the surface to be polished which includes a face comprising silicon oxide of a semiconductor substrate is polished.

13. An additive liquid for polishing, which is to be added to a dispersion liquid of a particle of a metal oxide to prepare a polishing agent, the additive liquid comprising a water-soluble polyamide having a tertiary amino group and/or an oxyalkylene chain in a molecule thereof, an organic acid and water, and having a pH of 7 or less.

14. The additive liquid for polishing according to claim 13, wherein the water-soluble polyamide has at least one of the tertiary amino group bonded to a main chain thereof or side chain thereof and the oxyalkylene chain bonded to the main chain.

15. The additive liquid for polishing according to claim 13, wherein the water-soluble polyamide is a copolymer obtained from: aminoethylpiperazine and/or a modified polyalkylene glycol; and a lactam.

* * * * *